US009385027B2

(12) United States Patent
Chang et al.

(10) Patent No.: US 9,385,027 B2
(45) Date of Patent: Jul. 5, 2016

(54) SUBLITHOGRAPHIC KELVIN STRUCTURE PATTERNED WITH DSA

(71) Applicant: GLOBALFOUNDRIES INC., Grand Cayman (KY)

(72) Inventors: Josephine B. Chang, Mahopac, NY (US); Michael A. Guillorn, Yorktown Heights, NY (US); Chung-Hsun Lin, White Plains, NY (US); HsinYu Tsai, White Plains, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 14/811,236

(22) Filed: Jul. 28, 2015

(65) Prior Publication Data
US 2015/0332958 A1 Nov. 19, 2015

Related U.S. Application Data

(62) Division of application No. 14/272,691, filed on May 8, 2014.

(51) Int. Cl.
*H01L 21/768* (2006.01)
*H01L 21/02* (2006.01)

(52) U.S. Cl.
CPC .... *H01L 21/76816* (2013.01); *H01L 21/02118* (2013.01); *H01L 21/76828* (2013.01); *H01L 21/76877* (2013.01); *H01L 21/76895* (2013.01)

(58) Field of Classification Search
None
See application file for complete search history.

(56) References Cited

U.S. PATENT DOCUMENTS 7,197,726 B2  3/2007  Ciplickas et al.
7,579,278 B2  8/2009  Sandhu
(Continued)

FOREIGN PATENT DOCUMENTS

EP        1906237 A2      4/2008
WO   WO2011128120 A1    10/2011
WO   WO2011151109 A1    12/2011

OTHER PUBLICATIONS

Tsai et al., "Sub-30 nm pitch line-space patterning of semiconductor and dielectric materials using directed self-assembly," J. Vac. Sci. Technol. B 30(6), Nov./Dec. 2012 (Published Nov. 2012).
(Continued)

*Primary Examiner* — Charles Garber
*Assistant Examiner* — Stanetta Isaac
(74) *Attorney, Agent, or Firm* — David Cain; Hoffman Warnick LLC

(57) ABSTRACT

In one aspect, a DSA-based method for forming a Kelvin-testable structure includes the following steps. A guide pattern is formed on a substrate which defines i) multiple pad regions of the Kelvin-testable structure and ii) a region interconnecting two of the pad regions on the substrate. A self-assembly material is deposited onto the substrate and is annealed at a temperature/duration sufficient to cause it to undergo self-assembly to form a self-assembled pattern on the substrate, wherein the self-assembly is directed by the guide pattern such that the self-assembled material in the region interconnecting the two pad regions forms multiple straight lines. A pattern of the self-assembled material is transferred to the substrate forming multiple lines in the substrate, wherein the pattern of the self-assembled material is configured such that only a given one of the lines is a continuous line between the two pad regions on the substrate.

12 Claims, 4 Drawing Sheets

(56) References Cited

U.S. PATENT DOCUMENTS

| | | |
|---|---|---|
| 8,039,196 B2 | 10/2011 | Kim et al. |
| 8,114,306 B2 | 2/2012 | Cheng et al. |
| 2010/0294740 A1 | 11/2010 | Cheng et al. |
| 2010/0311613 A1 | 12/2010 | Busnaina et al. |
| 2012/0220136 A1 | 8/2012 | Azuma |
| 2012/0331428 A1 | 12/2012 | Cheng et al. |

OTHER PUBLICATIONS

Yamaguchi et al., "Two-Dimensional Patterning of Flexible Designs With High Half-Pitch Resolution by Using Block Copolymer Lithography," Adv. Mater., vol. 20, Issue 9, pp. 1684-1689 (May 2008).

U.S. Appl. No. 14/811,236, filed Jul. 28, 2015.

U.S. Appl. No. 14/272,691, filed May 8, 2014.

List of IBM Patents or Applications Treated as Related.

Region containing only straight lines

Pads not covered by mask

SUBLITHOGRAPHIC KELVIN STRUCTURE PATTERNED WITH DSA

CROSS-REFERENCE TO RELATED APPLICATION(S)

This application is a divisional of U.S. application Ser. No. 14/272,691 filed on May 8, 2014, the entire contents of both of which are incorporated herein by reference.

FIELD OF THE INVENTION

The present invention relates to directed self-assembly (DSA) processes and more particularly, to techniques employing DSA to create devices, such as Kelvin-testable structures, at dense, sub-lithographic pitches.

BACKGROUND OF THE INVENTION

Directed self-assembly (DSA) is currently being explored for the formation of features at sub-lithographic pitch (i.e., at a pitch greater than that achievable using conventional lithography techniques). For instance, Yamaguchi et al., "Two-Dimensional Patterning of Flexible Designs With High Half-Pitch Resolution by Using Block Copolymer Lithography," Adv. Mater., Volume 20, Issue 9, pp. 1684-1689 (May, 2008) (hereinafter "Yamaguchi"), the contents of which are incorporated by reference herein, describe use of block copolymer self-assembly in conjunction with high-precision electron beam lithography to create two-dimensional self-assembly of diblock copolymers. According to the procedures in Yamaguchi, both bent lamellae and concentric cylinders were formed on a semiconductor substrate using hydrogen silsesquioxane (HSQ) guiding patterns. To date, however, DSA-based patterning techniques have been limited to producing simple shapes on a substrate, such as the bent lamellae and concentric cylinders described in Yamaguchi.

Accordingly, techniques for fabricating functioning, high-level devices with DSA would be desirable.

SUMMARY OF THE INVENTION

The present invention provides techniques for employing directed self-assembly (DSA) to create devices at dense, sub-lithographic pitches. In one aspect of the invention, a method for forming a Kelvin-testable structure is provided. The method includes the following steps. A guide pattern is formed on a substrate, wherein the guide pattern defines i) multiple pad regions of the Kelvin-testable structure and ii) a region interconnecting two of the pad regions on the substrate. A self-assembly material is deposited onto the substrate within the guide pattern. The self-assembly material is annealed at a temperature and for a duration sufficient to cause the self-assembly material to undergo self-assembly to form a self-assembled pattern on the substrate, wherein the self-assembly is directed by the guide pattern such that the self-assembled material in the region interconnecting the two pad regions forms multiple straight lines. A pattern of the self-assembled material in the region interconnecting the two pad regions is transferred to the substrate forming multiple lines in the substrate, wherein the pattern of the self-assembled material is configured such that only a given one of the lines is a continuous line between the two pad regions on the substrate.

In one aspect of the invention, a Kelvin-testable structure is provided. The Kelvin-testable structure includes multiple pad regions of the Kelvin-testable structure formed on a substrate; and multiple lines patterned in the substrate from a self-assembled material, wherein the lines have a pitch of from about 10 nanometers to about 75 nanometers, and wherein only a given one of the lines is a continuous line between two of the pad regions on the substrate.

A more complete understanding of the present invention, as well as further features and advantages of the present invention, will be obtained by reference to the following detailed description and drawings.

DETAILED DESCRIPTION OF PREFERRED EMBODIMENTS

Provided herein are a method and structure in which a layer of interest is patterned with a single lithography step into a Kelvin-testable single-line structure at dense (sub-lithographic) pitch using directed self-assembly (DSA). As provided above, DSA involves use of self-assembling materials (such as block copolymers) and a lithographically defined guide pattern (also referred to as prepatterns). The guide pattern serves to direct the self-assembly process and can be encoded with topographical information. See, for example, U.S. Patent Application Publication Number 2012/0331428 filed by Cheng et al., entitled "Method for Designing Optical Lithography Masks for Directed Self-Assembly" (hereinafter "U.S. Patent Application Publication Number 2012/0331428"), the entire contents of which are incorporated by reference herein. See also, U.S. Patent Application Publication Number 2010/0294740 filed by Cheng et al., entitled "Directed Self-Assembly of Block Copolymers Using Segmented Prepatterns," the entire contents of which are incorporated by reference herein.

A Kelvin testable structure can be used to test variations in a printed pattern. For instance, Kelvin testable structures printed at various locations across a wafer may be used to test the resistance response of a strip line to test for variations, e.g., in the width of the strip line across a wafer. See, for example, U.S. Pat. No. 7,197,726 issued to Ciplickas et al., entitled "Test Structures for Estimating Dishing and Erosion Effects in Copper Damascene Technology," the entire contents of which are incorporated by reference herein. It is however a challenge to create a Kelvin testable structure at sub-lithographic pitch (e.g., down to a 10 nanometer (nm)) pitch. Namely, it is difficult to pick out a nested strip line from which to form the Kelvin testable structure from a dense pattern of (sub-lithographically patterned) lines. Advantageously, the present techniques provide a way to leverage DSA patterning techniques to form a Kelvin testable structure at dense (sub-lithographic) pitch. Further, the process advantageously involves only two levels of high-throughput lithography.

Figure 1:
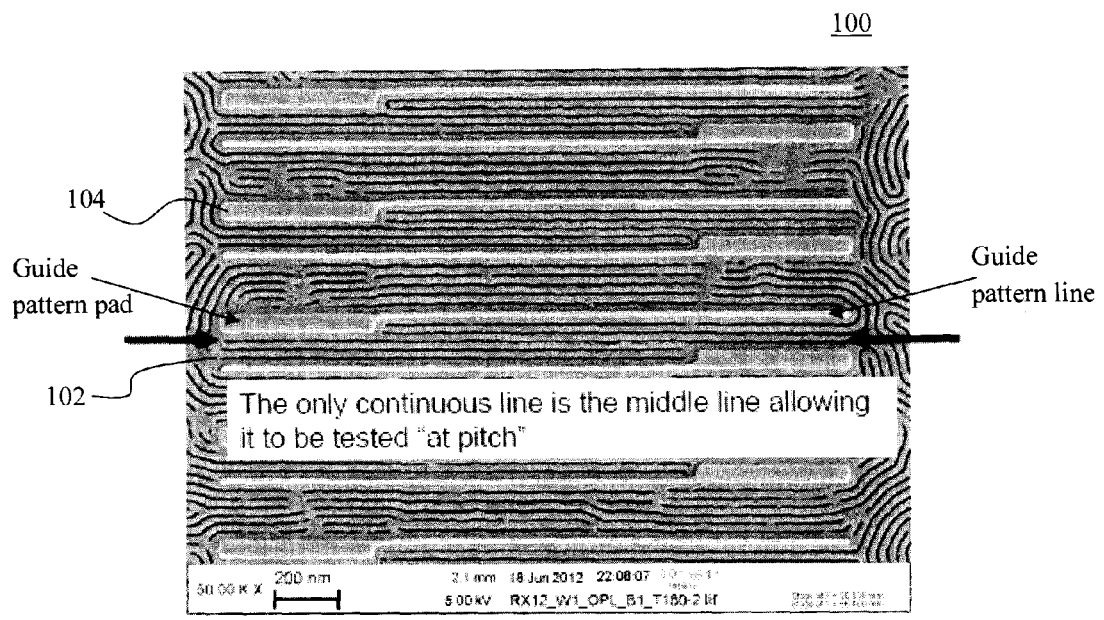
FIG. 1 is a top-down image of lines patterned at a tight pitch using the present directed self-assembly (DSA)-based techniques in a manner such that one nested line is isolatable from the others and thus can used, e.g., to form a Kelvin testable structure according to an embodiment of the present invention.

The present techniques are now described in detail by way of reference to FIGS. 1-7. FIG. 1 is a top-down image 100 of lines 102 patterned using the present DSA-based techniques. Image 100 illustrates how DSA can be used to pattern lines at a dense pitch (e.g., at a 15 nm pitch) yet provide one nested line that is isolatable from the others and thus can be used, for example, to form a Kelvin testable structure.

The DSA process will be described in detail below. In general however, as shown in FIG. 1, in order for the self-assembly process to be "directed," guide patterns 104 are first formed on the substrate. The guide patterns control the spatial arrangement of the self-assembly material. What is shown in FIG. 1 and what is important to note here is that the guide pattern employed herein is configured in such a manner that in each grouping of lines there is only one line nested in that group that is continuous. Namely, all of the other lines are cut off at one end or the other. This one single, continuous line is shown highlighted with bold arrows in FIG. 1. It is notable that while a single continuous line is desired for the instant example, in alternate embodiments, the number of lines which are continuous may be increased to be greater than one, e.g., two or three.

By way of example only, as shown in FIG. 1, the guide patterns 104 are configured such that the ends of the lines printed above the (highlighted) continuous line are cut off on their left sides and the ends of the lines printed below the (highlighted) continuous line are cut off on their right sides. This is achieved by configuring the guide patterns 104 to form a space therebetween in which the lines are formed. The space formed between the guide patterns is constricted such that, during the DSA process, the self-assembled material forms a pattern for the lines in which only one of the lines is continuous along a length of the space.

The guide pattern used to pattern the lines (by way of the present DSA process) can take a variety of different forms. In the example shown in FIG. 1, regions not constrained by guide patterns show characteristic "finger print-like patterns." In regions in which the guide pattern consists of a series of long lines, the number of lines self-assembled between each guiding pattern is determined with great specificity by the ratio of guide pattern spacing and the molecular characteristics of the self-assembly material, with a preferred number of lines ranging from about 1 to about 12. By widening the end of a guiding pattern line into a paddle, self-assembled lines nearest the guiding patterns may be terminated selectively to neighboring lines. The width of the paddle may be modulated to terminate 1, 2, 3, or more line ends with high specificity. By using "L-shaped" paddles and guiding pattern placement such as that shown in FIG. 1, line ends may be terminated such that only a specific number of nested lines, preferably one or two, extend the full length of the guiding patterns. The configuration of the guide pattern so as to yield only a specific/desired number of continuous lines along a length of the space is of course dependent, in part, on the self-assembly material being employed, process conditions, etc. By way of example only, the techniques described in U.S. Patent Application Publication Number 2012/0331428 may be used to help configure the guide pattern for a particular set of conditions. For instance, U.S. Patent Application Publication Number 2012/0331428 describes use of a computer to i) generate a prepattern (i.e., guide pattern) shape based on features of a target design shape, and to ii) evaluate if a DSA pattern of the self-assembly material based on the prepattern shape is within specified ranges of dimensional and positional targets of the target design shape.

Figure 2:
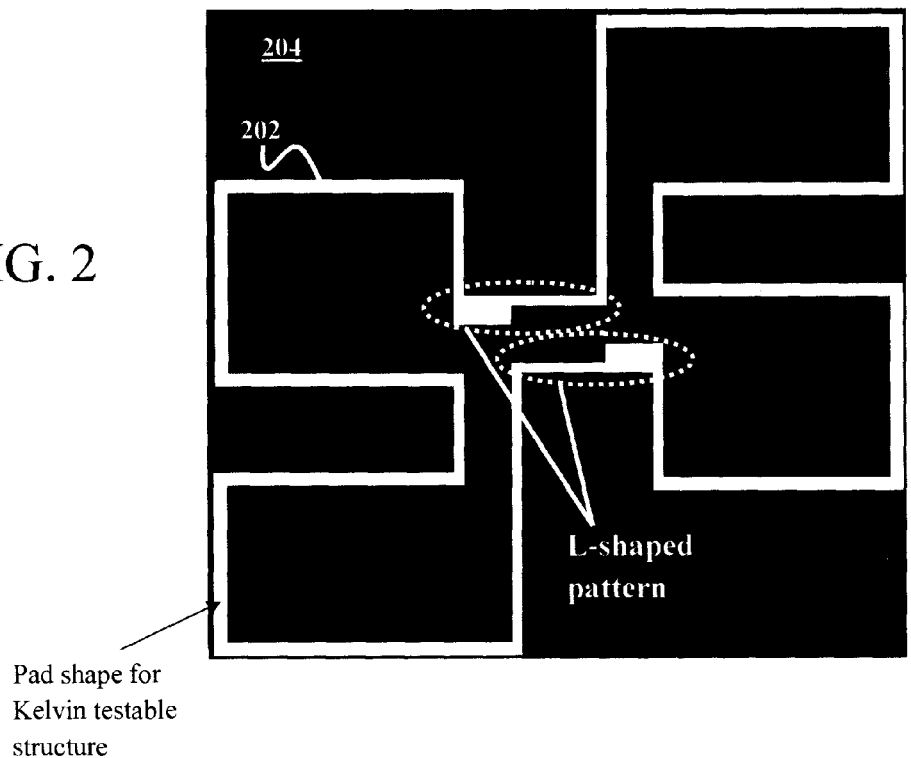
FIG. 2 is a top-down diagram illustrating a guide pattern having been formed on a substrate according to an embodiment of the present invention.

The process for forming a functional Kelvin testable structure using this concept is now described in detail. FIG. 2 is a top-down diagram illustrating a guide pattern 202 having been formed on a substrate 204. The term "substrate" as used herein refers generally to any (target) layer in which a Kelvin testable device is to be patterned. By way of example only, the substrate 204 may be a middle of the line dielectric layer for a conventional damascene wiring level.

As shown in FIG. 2, the guide pattern follows the above-described configuration wherein a space is defined in which the lines are to be formed, and wherein the space is constricted such that, during the DSA process, the self-assembled material forms a pattern for the lines in which only one of the lines is continuous along a length of the space. In the example shown in FIG. 2, the same exemplary configuration as that of FIG. 1 is employed, wherein the space is defined by two "L-shaped" portions of the guide pattern positioned facing one another, wherein a line and a pad make up each "L-shaped" pattern (see FIG. 2). As described above, by having the pads pointing into the space on opposite sides of the adjacent lines, the space is constricted such that only a specific and desired number of the lines formed (by DSA) are continuous along a length of the space.

As also shown in FIG. 2, in this exemplary embodiment, a Kelvin testable structure is being formed which requires four pads—hence the configuration of the guide pattern to include four pad shapes. Thus, in this example, the guide pattern defines multiple pad regions of the Kelvin-testable structure and a region interconnecting the pad regions. It is in this region interconnecting the pad regions that the above-described lines of the Kelvin-testable structure will be formed. Thus, this region may also be referred to herein as a "line region" of the structure. As will be described in detail below, the term "pad region" as used herein refers generally to the region in which pads (in this case two pads) will be formed on either side of the line region. Thus, in the example shown in FIG. 2 there is one pad region to the left of the line region and a second pad region to the right of the line region, wherein each pad region defines two pad shapes.

It is however notable that that the techniques described herein are not limited to forming only Kelvin testable structures. By way of example only, the present techniques can be employed generally in any situation where very thin lines are desired, such as in the case of high-resistance resistors or fuses.

According to an exemplary embodiment, the guide pattern 202 is formed directly in a surface of the substrate 204 using conventional patterning, i.e., lithography and etching, processes wherein—for example—a patterned resist is formed on the substrate 204 having the footprint and location of the guide pattern 202. The substrate is then patterned using the resist, followed by removal of the resist. Alternatively, the guide pattern may be formed in a layer that is deposited onto the substrate 204. By way of example only, a layer of a hardmask material (e.g., silicon nitride (SiN)) may be deposited onto the substrate 204 and patterned to form the guide pattern 202 on the substrate 204. Again conventional lithography and etching techniques may be employed. Alternately, the guide pattern may be resist, which is patterned with conventional lithography.

Figure 3:
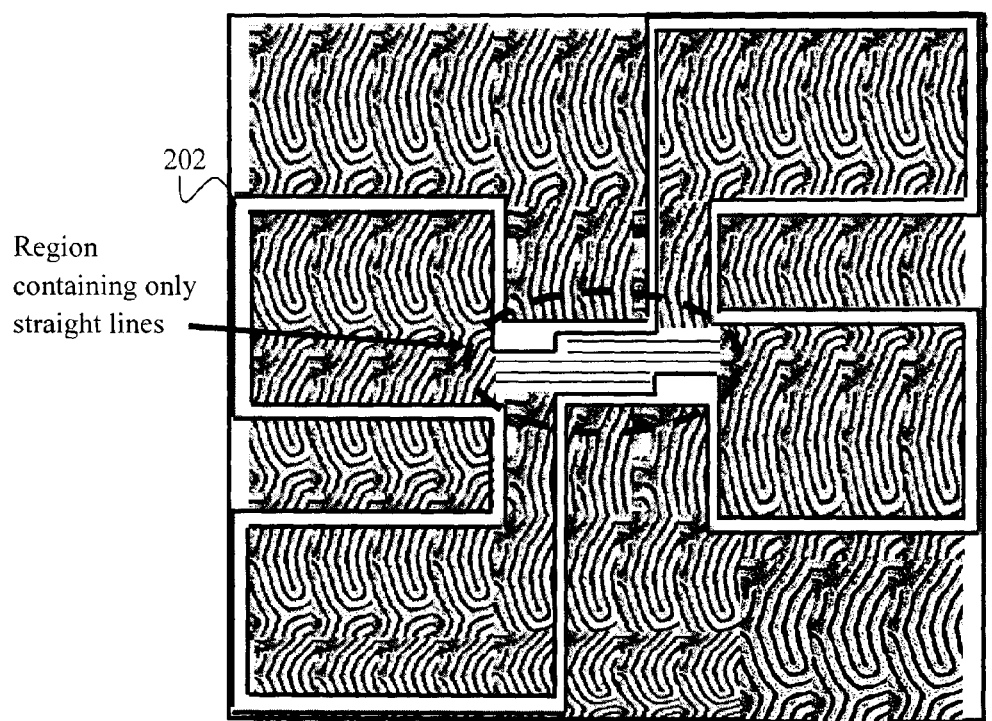
FIG. 3 is a top-down diagram illustrating a self-assembly material having been deposited onto the substrate and within the guide pattern which will undergo self-assembly to form a self-assembled material according to an embodiment of the present invention.

Next, as shown in FIG. 3, a self-assembly material is deposited onto the substrate 204 and within the guide pattern 202. When the self-assembly material is annealed at a certain temperature for a certain duration, the self-assembly material will undergo self-assembly to form a self-assembled pattern 302 on the substrate. This self-assembly of the material is directed by the guide pattern. As described above, according to the present techniques, the guide pattern 202 is configured such that the self-assembled pattern 302 forms multiple straight lines (i.e., in the line region interconnecting the pad regions). However, when the pattern of the lines from the self-assembled material is transferred to the substrate, so as to form multiple lines in the substrate, only a specific and desired number of the lines formed in the substrate will be a continuous line between the two pad regions (in the example shown, a single continuous line between the two pad regions is desired). Namely, as provided in the example given above, the guide pattern and the resulting self-assembled pattern 302 can be configured such that an end of each of the lines, other than the one continuous line, is cut off before reaching one of the two pad regions.

According to an exemplary embodiment, the self-assembly material is a block copolymer. Suitable block copolymers include, but are not limited to, diblock copolymers, such as a random copolymer of polystyrene (PS) and poly(methyl methacrylate) (PMMA) (abbreviated as PS-ran-PMMA) or a PS-block-PMMA copolymer (abbreviated as PS-b-PMMA).

As described in U.S. Patent Application Publication Number 2012/0331428, under proper conditions, block copolymers will separate into microdomains to reduce the total free energy, and in the process, nanoscale features of the dissimilar chemical composition are formed. By way of example only, the block copolymer may be spin coated onto the substrate to ensure adequate and uniform coverage, and then annealed at a temperature of from about 190 degrees Celsius (° C.) to about 250° C. for a duration of from about 2 minutes to about 30 minutes (wherein higher temperatures would generally require a shorter annealing time), to permit the block copolymer to separate into the microdomains aligned along the surface of the substrate. The aligned microdomains form the bent lamellae and lines shown in FIG. 3.

As described above, according to the present techniques, the guide pattern 202 is configured (e.g., by way of two "L-shaped" portions of the guide pattern) to define a space in which lines are formed (by the instant DSA process), and wherein the space is constricted such that the self-assembled material forms a pattern for the lines in which only one of the lines is continuous along a length of the space. This region is shown highlighted in FIG. 3. What is important to note at this stage in the process is that the self-assembled pattern 302 in this region forms straight lines based on the configuration of the guide pattern in this region—which directs self-assembly of the material in this manner. By comparison, the self-assembled material forms fingerprint-shaped patterns on other areas of the substrate. See FIG. 3.

Figure 4:
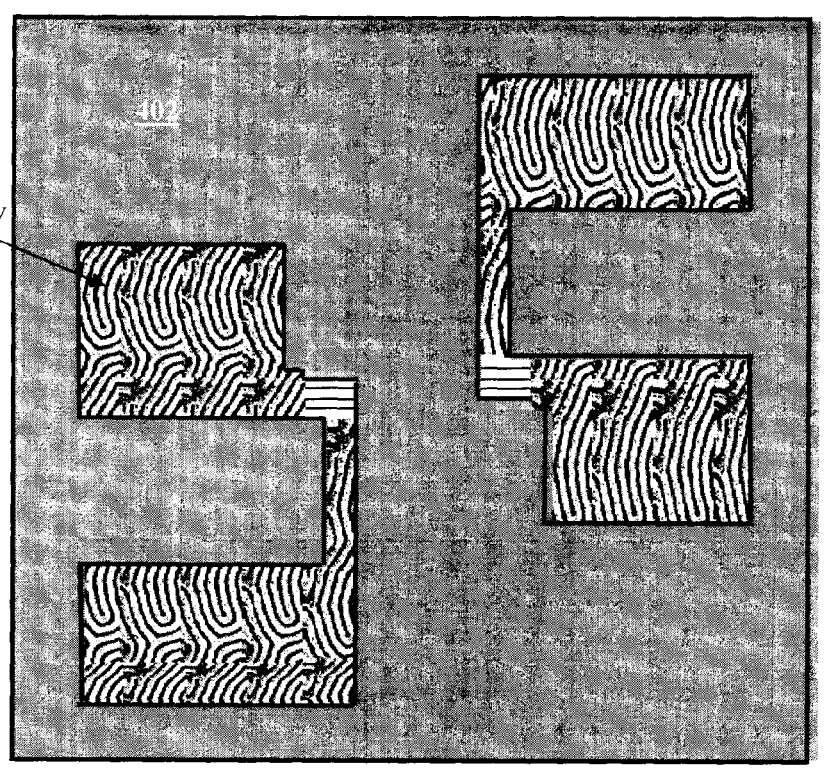
FIG. 4 is a top-down diagram illustrating a patterned mask having been formed on the substrate over the self-assembled material which covers/masks all areas of the substrate except those corresponding to pads of a Kelvin-testable structure, as well as regions linking the pads to a line of the Kelvin-testable structure according to an embodiment of the present invention.

As highlighted above, in order to form a Kelvin testable structure, a line is needed as well as two pads coming out from each end of the line. The process for forming the pads in this exemplary embodiment is now described. As shown in FIG. 4, a patterned mask 402 is formed on the substrate over the self-assembled pattern 302. The mask may be formed from a standard photoresist material and may be patterned using conventional lithography and etching processes. In this particular example shown in FIG. 4, the patterned mask 402 covers/masks all areas of the substrate except those corresponding to the (four) pads of the Kelvin-testable structure, as well as the regions linking the pads to the line. The pads and the regions linking the pads to the line are also referred to herein simply as "pad regions." Further, for clarity of description, the pad region to one (a first) side of the line (which contains two pads and the region connecting the pads to the line) may be referred to herein as a first pad region, and the pad region to the other side (a second) side of the line (which also contains two pads and the region connecting the pads to the line) may be referred to herein as a second pad region.

Figure 5:
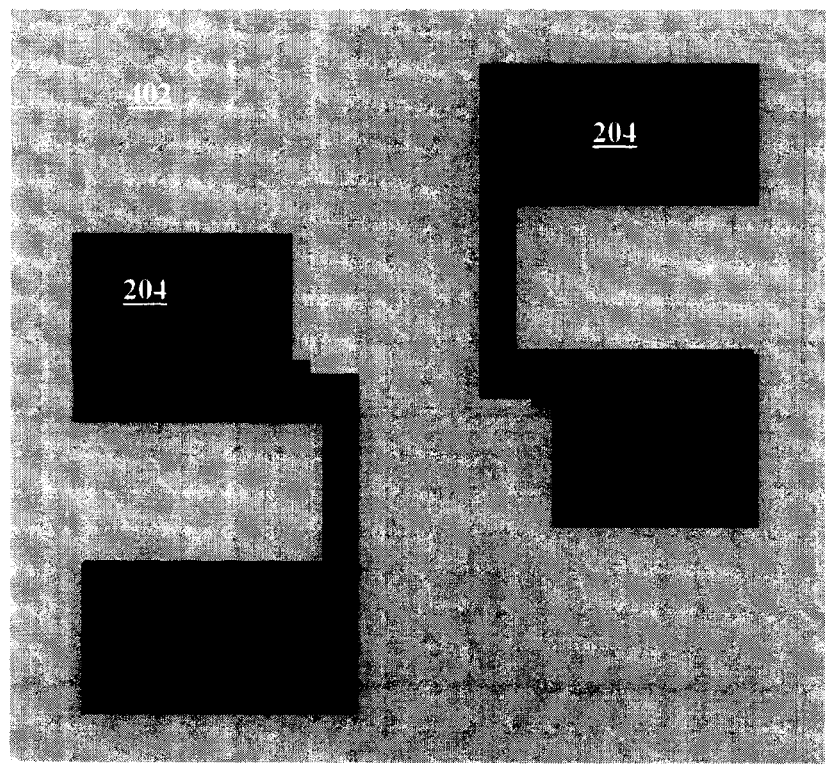
FIG. 5 is a top-down diagram illustrating an etch through the patterned mask having been used to remove the self-assembled material in the pad areas and the regions linking the pads to the line according to an embodiment of the present invention.

An etch through the patterned mask 402 is then used to remove the self-assembled pattern 302 in the pad regions. See FIG. 5. According to an exemplary embodiment, reactive ion etching (RIE) is used in this step. As shown in FIG. 5, following this etching step, the self-assembled pattern 302 is now cleared from the substrate 204 in the patterned areas (i.e., in the pad areas). It is notable that the self-assembled material is assembled into a pattern of features, such as lines, bent lamellae, etc. These patterns are the white (straight, curved, concentric, etc.) lines shown in the figures and described generally herein as the self-assembled material. The black areas between the white lines are the underlying substrate 204. Accordingly, the pattern from the self-assembled pattern 302 can then be transferred to the underlying substrate 204 later on in the process.

Figure 6:
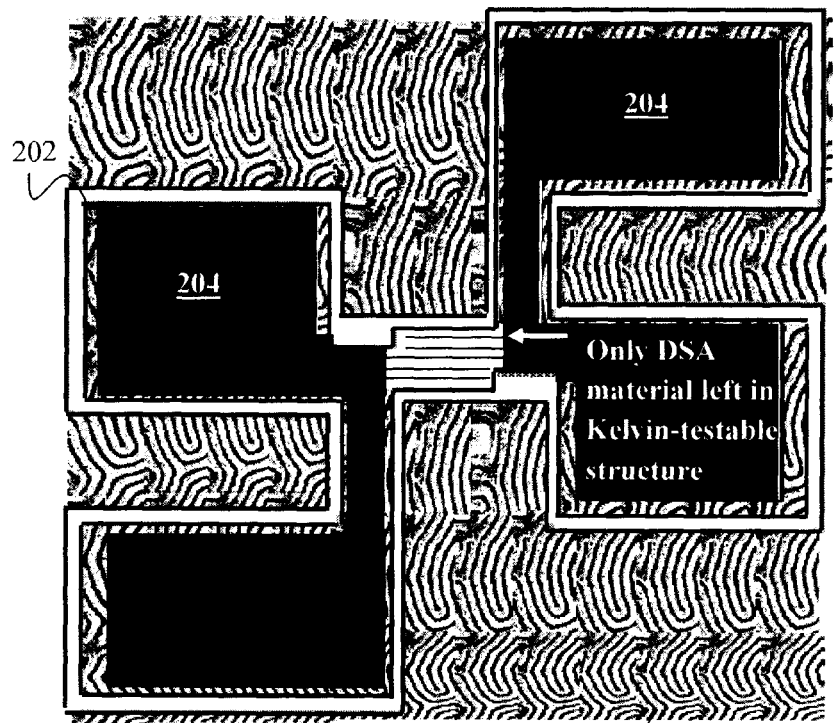
FIG. 6 is a top-down diagram illustrating the patterned mask having been removed according to an embodiment of the present invention.

Further, as a result of this etching step, the only self-assembled pattern 302 remaining in the Kelvin-testable structure forms the straight lines interconnecting the pad regions. This configuration is revealed by removal of the patterned mask 402. See FIG. 6. The patterned mask 402 may be removed using a wet etching process. As shown in FIG. 6, there might be some self-assembled pattern 302 material left remaining between the patterned pad and the guide pattern. This is just for any misalignment. If the patterned pad extends beyond guide pattern, it would be a short. If the patterned pad does not quite reach the guide pattern, then it does not matter.

Following removal of the patterned mask 402, an etch is performed to transfer the pattern from the self-assembled pattern 302 into the underlying substrate 204. See FIG. 7. As provided above, the substrate is any (target) layer in which a Kelvin testable device is to be patterned, e.g., a middle of the line dielectric layer for a conventional damascene wiring level. By way of example only, the substrate may be patterned using a RIE process. Black features in FIG. 7 indicate regions which will be electrically conductive in the final structure, and white features indicate regions which will be non-electrically conductive. For damascene metal lines, for example, black features would be transferred into the substrate as a trench which is then filled with metal (e.g., copper). As another example, for silicon fins, black features would be transferred into a silicon substrate as pillars. Both polarities of pattern transfer (trench vs. pillar) can be achieved using tone inversion techniques.

Figure 7:
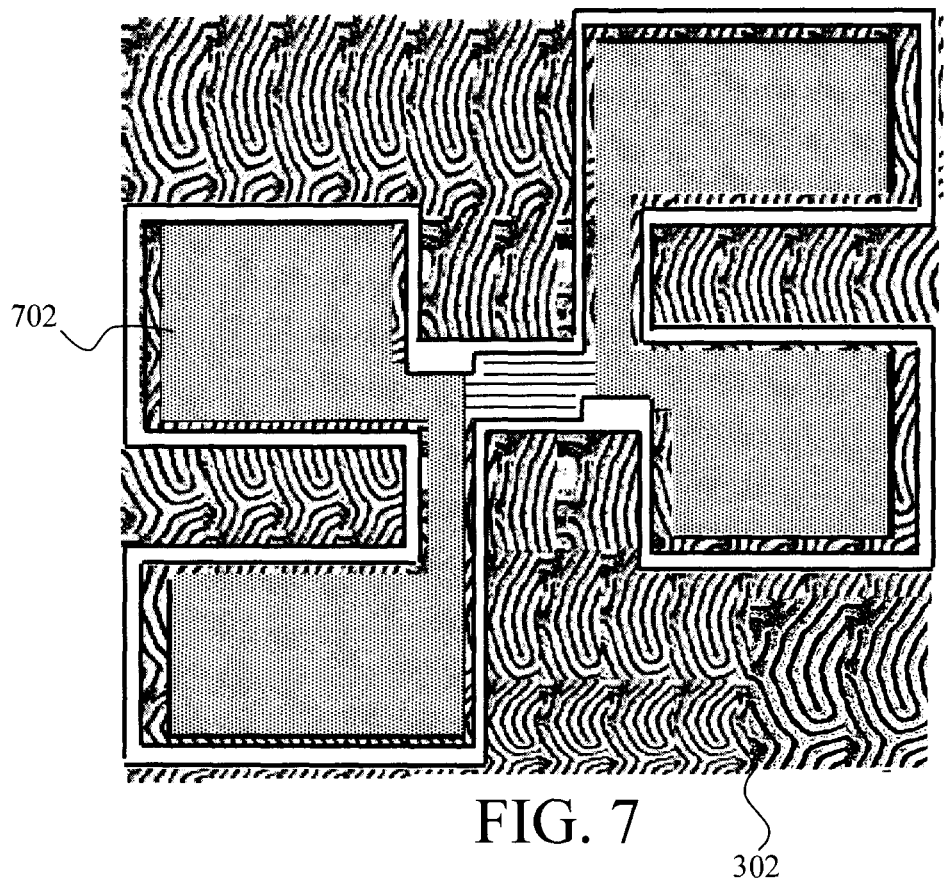
FIG. 7 is a top-down diagram illustrating an etch having been performed to transfer the pattern from the self-assembled material into the underlying substrate and pads having been formed which are in contact with the line according to an embodiment of the present invention.

As shown in FIG. 7, the result of the pattern transfer etch is a plurality of straight lines, however only one of the nested lines is continuous from one (first) pad region to the other (second) pad region. All of the other lines patterned are cut off on one end or the other. According to an exemplary embodiment, the lines are patterned at a pitch of from about 10 nanometers (nm) to about 75 nm. The term "pitch" as used herein refers to the distance between a point on one line to the same point on an adjacent line. With conventional techniques selecting a single nested line at such a dense pitch would be extremely difficult. However, by employing a DSA process as described above, the present techniques yield a Kelvin testable structure wherein the lines can be tested at pitch.

As shown in FIG. 7, pads 702 are formed on the substrate which are in contact with the one continuous line between the pad regions (see above). Further, as highlighted above, in the case of a Kelvin-testable structure each of the pad regions defines two pads such that when the pad regions are filled with an electrically conductive material (e.g., copper) as shown in FIG. 7, two of the pads are formed in contact with one end (i.e., a first end) of the continuous line between the two pad regions and two of the pads are formed in contact with another end (i.e., a second) end of the continuous line between the two pad regions.

The Kelvin testable structure provided herein would be useful for a quick turn-around evaluation of dense structures at sub-lithographic pitch. For example, it could be used to evaluate RIE at target pitch for cross-wafer uniformity. However, the formation of a Kelvin testable structure is only one exemplary implementation of the present techniques. The processes described herein could be used to fabricate a variety of different devices, including those requiring isolation of specific lines out of a series of nested lines at dense pitch.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming a Kelvin-testable structure, the method comprising the steps of:
    forming a guide pattern on a substrate, wherein the guide pattern defines i) multiple pad regions of the Kelvin-testable structure and ii) a line region interconnecting two of the pad regions on the substrate;
    depositing a self-assembly material onto the substrate within the guide pattern;
    annealing the self-assembly material at a temperature and for a duration sufficient to cause the self-assembly material to undergo self-assembly to form a self-assembled pattern on the substrate, wherein the self-assembly is directed by the guide pattern such that i) the self-assembled material in the line region interconnecting the two pad regions forms multiple straight lines, and ii) the guide pattern terminates one or more of the lines selective to neighboring lines; and
    transferring a pattern of the self-assembled material in the line region interconnecting the two pad regions to the substrate forming multiple lines in the substrate, wherein the pattern of the self-assembled material is configured such that only a single given one of the lines is a continuous line between the two pad regions on the substrate with all other lines being discontinuous lines that do not connect to one of the pad regions and thus, while nested in the other lines, the single given line is an only continuous line between two of the pad regions on the substrate.

2. The method of claim 1, further comprising the steps of:
    removing the self-assembled material from the pad regions; and
    filling the pad regions with an electrically conductive material to form pads on the substrate, wherein the pads are in contact with the continuous line between the two pad regions.

3. The method of claim 2, wherein each of the pad regions defines two pads of the Kelvin-testable structure such that when the pad regions are filled with the electrically conductive material two of the pads are formed in contact with a first end of the continuous line between the two pad regions and two of the pads are formed in contact with a second end of the continuous line between the two pad regions.

4. The method of claim 1, wherein the lines are formed in the substrate at a pitch of from about 10 nanometers to about 75 nanometers.

5. The method of claim 1, wherein the pattern of the self-assembled material is configured such that an end of each of the lines, other than the continuous line between the two pad regions, is cut off before reaching one of the two pad regions.

6. The method of claim 1, wherein the substrate comprises a dielectric layer.

7. The method of claim 1, wherein the guide pattern is formed by patterning a surface of the substrate.

8. The method of claim 1, wherein the guide pattern is formed in a layer deposited onto the substrate.

9. The method of claim 1, wherein the self-assembly material comprises a block copolymer.

10. The method of claim 9, wherein the block copolymer comprises a random copolymer of polystyrene (PS) and poly (methyl methacrylate) or a PS-block-PMMA copolymer (PS-b-PMMA).

11. The method of claim 1, wherein the self-assembly material is annealed at a temperature of from about 190° C. to about 250° C.

12. The method of claim 1, wherein the self-assembly material is annealed for a duration of from about 2 minutes to about 30 minutes.

* * * * *